United States Patent [19]

Burns

[11] Patent Number: 4,754,912
[45] Date of Patent: Jul. 5, 1988

[54] CONTROLLED COLLAPSE THERMOCOMPRESSION GANG BONDING

[75] Inventor: Carmen D. Burns, San Jose, Calif.
[73] Assignee: National Semiconductor Corporation, Santa Clara, Calif.
[21] Appl. No.: 122,486
[22] Filed: Nov. 16, 1987

Related U.S. Application Data

[63] Continuation of Ser. No. 597,805, Apr. 5, 1984, abandoned, which is a continuation of Ser. No. 450,888, Dec. 17, 1982, abandoned, which is a continuation of Ser. No. 921,642, Jul. 3, 1978, abandoned.

[51] Int. Cl.⁴ .............................................. H01L 21/58
[52] U.S. Cl. ................................. 228/164; 228/180.2; 357/70
[58] Field of Search ...................... 228/180.2, 6.2, 164, 228/170; 174/52 FP; 357/70

[56] References Cited

U.S. PATENT DOCUMENTS

| | | | |
|---|---|---|---|
| 3,440,027 | 4/1969 | Hugle | 428/601 |
| 3,589,000 | 6/1971 | Galli | 228/180.2 X |
| 3,625,837 | 12/1971 | Nelson et al. | 204/15 |
| 3,680,206 | 8/1972 | Roberts | 357/68 |
| 3,825,353 | 7/1974 | Loro | 357/68 |
| 3,832,769 | 9/1974 | Olyphant et al. | 29/589 |
| 3,838,984 | 10/1974 | Crane et al. | 428/601 |
| 3,859,718 | 1/1975 | Noe | 228/180.2 X |
| 3,868,724 | 2/1975 | Perrino | 357/68 |
| 3,882,532 | 5/1975 | Quinn | 357/68 |
| 4,007,479 | 2/1977 | Kowalski | 357/70 |
| 4,010,885 | 3/1977 | Keizer et al. | 228/6.2 |
| 4,072,982 | 2/1978 | Stein | 357/68 |
| 4,143,385 | 3/1979 | Miyoshi et al. | 357/68 |
| 4,209,355 | 6/1980 | Burns | 357/70 |
| 4,210,926 | 7/1980 | Hacke | 357/70 |
| 4,259,436 | 3/1981 | Tabuchi et al. | 29/576 S |
| 4,308,339 | 12/1981 | Lindburg | 357/70 |
| 4,312,926 | 1/1982 | Burns | 428/571 |
| 4,331,831 | 5/1982 | Ingram et al. | 357/70 |

FOREIGN PATENT DOCUMENTS 140465  10/1979  Japan .................................. 357/70

Primary Examiner—Kenneth J. Ramsey
Attorney, Agent, or Firm—Gail W. Woodward

[57] ABSTRACT

Controlled shape bumps are fabricated into the metal contact fingers that are to be used in the gang bonding assembly of semiconductor devices. The bump shape permits the gang bonding of a plurality of contact fingers simultaneously while producing reliable, uniformly high strength bonds.

5 Claims, 2 Drawing Sheets

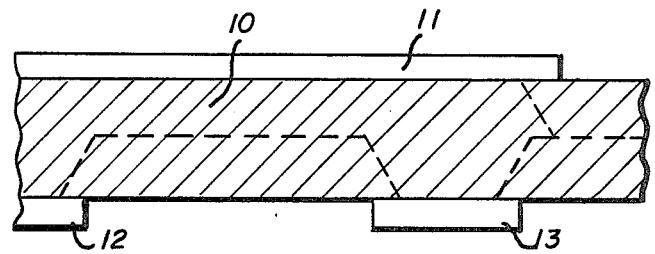
Fig_1
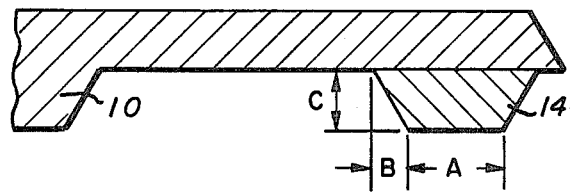
Fig_2a
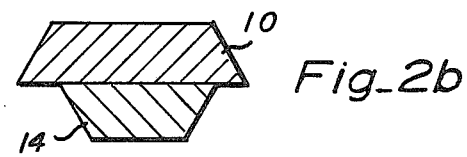
Fig_2b
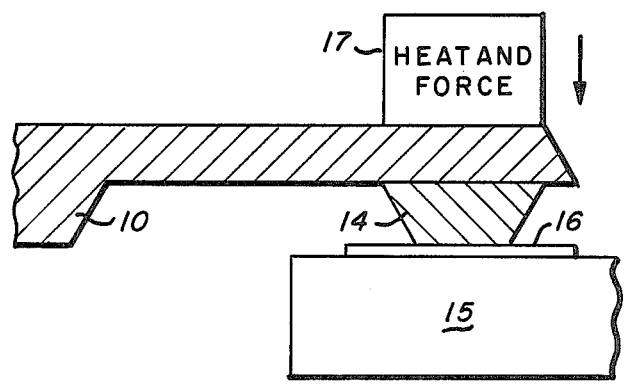
Fig_3
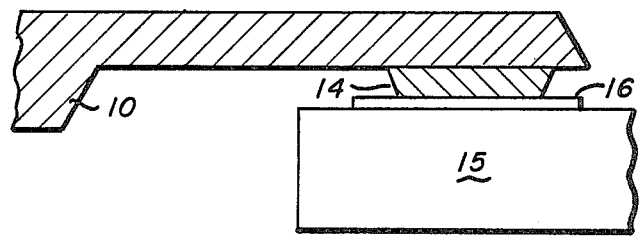
Fig_4
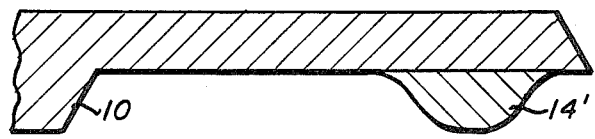
Fig_5

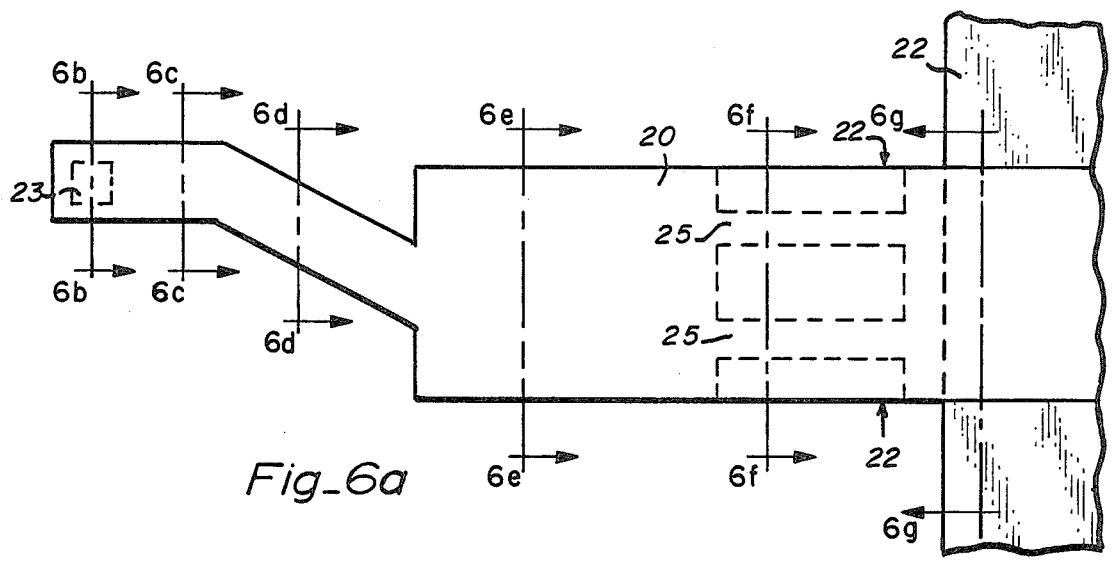
Fig_6a
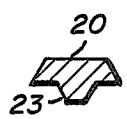
Fig_6b
Fig_6c
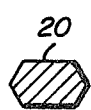
Fig_6d
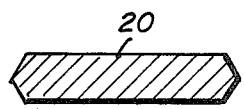
Fig_6e
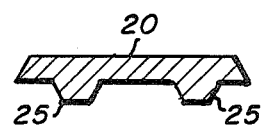
Fig_6f
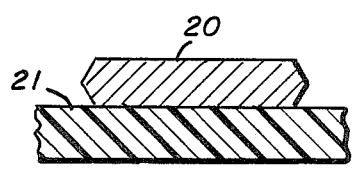
Fig_6g
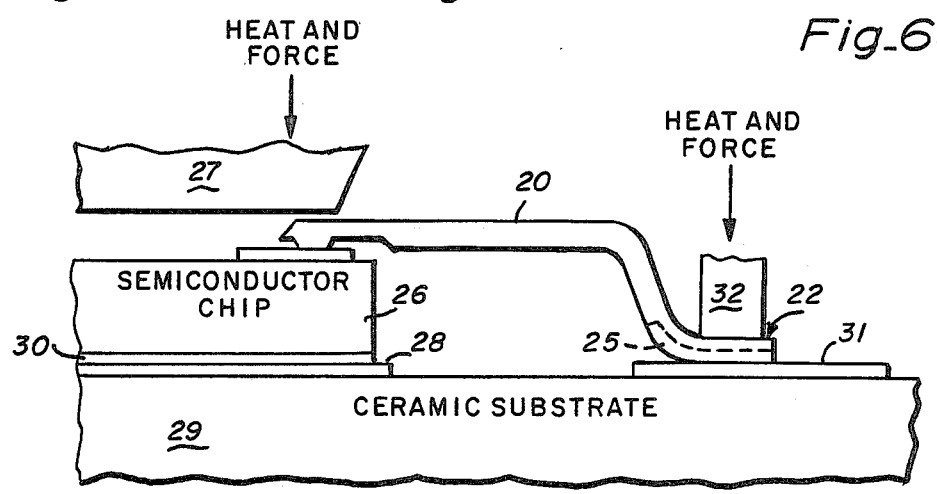
Fig_7

CONTROLLED COLLAPSE THERMOCOMPRESSION GANG BONDING

This application is a continuation of application Ser. No. 597,805, filed Apr. 5, 1984, now abandoned, which is a continuation of Ser. No. 450,888, filed Dec. 17, 1982, now abandoned; which is a continuation of Ser. No. 921,642, filed July 3, 1978, now abandoned.

BACKGROUND OF THE INVENTION

In my copending application Ser. No. 921,643 filed July 3, 1987 now Pat. No. 4,209,355 and titled MANUFACTURE OF BUMPED COMPOSITE TAPE FOR AUTOMATIC GANG BONDING OF SEMICONDUCTOR DEVICES a process is disclosed for creating an array of metal fingers that can be gang bonded to a semiconductor chip while still associated with a composite tape. This tape method of automatic assembly is capable of high speed so that assembly costs can be greatly reduced. After the semiconductor chip is bonded to the tape mounted fingers it can be automatically positioned with respect to the ultimate device mounting structure such as a lead frame or hybrid substrate. The chip and its bonded fingers can then be excised from the tape and gang bonded to the lead frame or hybrid substrate. Then conventional packaging is employed to complete the structure. As pointed out in the above-mentioned copending application, it is often desirable to create bumps on the metal fingers so that contact can be made to the conventional bonding pads normally employed on monolithic integrated circuit devices. Typically the fingers are made of copper which is thermocompression bonded, aluminum which is ultrasonically bonded, or tinned metal which is soldered. Ideally the plurality of bonds that must be made are completed simultaneously in what is called gang bonding. However, it has been found that gang bonding often results in a wide variability in individual bonds. This means that in a multiple bond operation the likelihood of at least one poor bond is high. This creates an intolerable reliability problem.

Soldering is regarded as useful, but the process must be kept extremely clean or corrosive fluxing must be used and solder flow must be controlled. Ultrasonic welding is effective but has not proven reliable in gang bonding and ultrasonic welding requires complicated equipment. Thermocompression bonding has worked out reasonably well, particularly on bumped semiconductor chips, but some problems are encountered, particularly in lead frame and hybrid substrate gang bonding.

One alternative that has been employed is wobble bonding. Here instead of trying to bond all fingers simultaneously, the bonding tool is tilted and rotated so that the bonding surface "walks" across the fingers in sequence. This is a compromise between gang bonding and single bonding and is very difficult to achieve in automatic equipment. At best it is slower than gang bonding.

SUMMARY OF THE INVENTION

It is an object of the invention to provide a bumped composite assembly tape that can be reliably gang bonded.

It is a further object of the invention to provide a bump shape on a metal finger that is part of a composite tape wherein the bump collapses during bonding to control the bonding operation.

These and other objects are achieved as follows. In a composite tape that is to be used in the automatic assembly of semiconductor devices a bump is created on the metal tape fingers where they are to be bonded. The bump has a trapezoidal cross section shape arranged so that the smaller face first contacts the surface to which the finger is to be bonded. The bump face can be of any desired shape such as round, square, oval or rectangular. As bonding proceeds the bump collapses partially so the contact area grows laterally. By controlling the shape of the bump very reliable bonds can be achieved. Because of the controlled collapse of plurality of such bonds can be made simultaneously.

BRIEF DESCRIPTION OF THE DRAWING

FIG. 1 is and edge view of a tape finger being processed in composite tape form;

FIG. 2a is a section of a tape finger with a bumped end;

FIG. 2b is a cross section of the bumped end of the finger of FIG. 2a;

FIG. 3 shows the bumped finger in place on a semiconductor chip pad prior to bonding;

FIG. 4 shows the bumped finger after bonding;

FIG. 5 shows a bump shape alternative to the shape shown in FIG. 2a;

FIG. 6a shows a metal finger in place on a fragment of composite tape;

FIGS. 6b through 6g show various cross sections of the finger of FIG. 6a; and

FIG. 7 shows the relation of the finger of FIG. 6a to a hybrid semiconductor chip assembly after the finger is excised from a composite tape and prior to bonding.

DESCRIPTION OF THE INVENTION

FIG. 1 shows a section of a copper strip 10. The copper is selected to have a hardness that is suitable for the thermocompression bonding to the contact pads on a semiconductor device chip. When the chip pads are of aluminum, they are ordinarily overcoated with a suitable metallization such as chromium and gold. Strip 10 is typically composed of conventional copper commercially available as alloy 110 fired ½ hard. The strip is shaped by etching as taught in detail in my copending application Ser. No. 921,643 filed July 3, 1978 now Pat. No. 4,209,355. The etching is controlled by photosensitive resist application. After photo exposure and development etch resist is present at 11, 12, and 13. The etch removes approximately half of the metal thickness as indicated by the dashed lines. After etching and resist stripping the end of strip 10 is as shown in FIG. 2.

I have discovered that by controlling the shape of bump 14, the hardness of the copper in bump 14, and the thermocompression temperature and pressure, extremely reliable bonds can be created. Such bonds have controlled adherence and, surprisingly, can be made in simultaneous multiples. Thus, bump 14 permits the assembly of semiconductor chips into packages using gang bonding. This greatly speeds up the bonding process and makes it more uniform.

The shape of bump 14 is described as follows with reference to FIG. 2. Dimension A, the bump face, is typically square but other shapes can be employed. The face has an area of about 3 square mils. Dimension A is typically between about 1.5 and 2 mils. Dimension C, the bump height, is desirably between about 1.1 to 1.5 mils. The slope of the bump, which is set by the ratio of dimension C to dimension B, is made about 2.5 to 1 to 3.0 to 1. This gives the bump face a slope of about 68°. The bump, therefore, is substantially trapezoidal in cross section as shown.

FIG. 3 shows a bump 14 in place on a bonding pad 16 on a silicon semiconductor chip 13 which includes one or more active semiconductor devices (not shown). While not shown, pad 16 can be aluminum overcoated with thin layers of chromium or some other barrier metal and gold or some other non-corrosive contacting metal. If desired, the bump 14 can be coated with nickel and gold and bonded directly to an aluminum pad. Heat and pressure are applied to the assembly as illustrated at 17. This could be in the form of the well-known thermode used in semiconductor thermocompression bonding. If desired, chip 15 can also be heated during bonding.

FIG. 4 shows the structure after bonding. Bump 14 has collapsed and spread out to a degree determined by the above cited variables. By comparing FIGS. 3 and 4 it can be seen that as pressure is first applied it is localized to a small area (about 3 square mils). As the bump collapses, the area rises rapidly so that the collapse is limited, and therefore, controlled. It is clear that during collapse there is metal flow perpendicular to the applied force and this produces a scrubbing action between bump 14 and pad 16.

While FIGS. 1 through 4 show a trapezoidal bump and trapezoidal finger construction, only the bump need have this particular shape. The rest of the finger portion can have any desired shape including square edges.

The basis action described above and shown in FIGS. 3 and 4 is fundamental to the invention. The invention permits a copper finger to be bonded to the conventional IC aluminum bonding pads. While the finger is shown bonded to a flat IC pad, it could just as well be bonded to a bumped chip as would be used for a flat metal finger bond. Where a bond is to be made to an aluminum IC pad it is preferred that either the aluminum pad be overcoated as described above or the copper finger be plated with a nickel layer about 10 to 20 microinches thick followed by a gold layer about 5–50 microinches thick. When the IC bonding pads are to be overcoated, a barrier metal such as nickel, titanium or chromium or combinations thereof, is applied first and followed by a gold flash (about 1,000 to 2,000A thick) has proven useful. In either of the above two alternatives the additional metal layers are so thin that they do not measurably change the bump geometry as shown in FIGS. 3 and 4.

In the bump bonding process, the thermode 17 is typically operated at about 450° to 550° C. If desired, the IC can be preheated from 100° to 200° C. The actual temperatures can be optimized for a particular metallurgical system.

If bump 14 has too small a face, the bonding pressure must be kept low and a smaller bond area tolerated. This means a reduced strength bond is achieved. If the bump face is too large, the transverse metal flow in cold welding is confined to the periphery of the bump because the central portion will be constrained. This results in a strained bond.

As explained above, the bump partly collapses so that the height of the bump is limited by the collapse. Clearly the bump should be higher than the desired collapse, so that after bonding the finger adequately clears the edge of the IC chip. Making the bump still higher serves no useful purpose.

The slope of the bump face determines the degree of collapse for a particular pressure temperature and hardness. Too steep a face results in reduced control of the degree of collapse. Too shallow a face results in too greatly reduced collapse. From the above factors it can be seen that a controlled shape will first ensure enough collapse to produce the flow needed for bonding. Since the bump is tapered, its collapse will be self-limiting as a function of shape.

The last factor, the hardness of the copper, will be largely a materials processing item. The harder the copper, the greater will be the pressure required for the bonding operation. Thus, the above listed dimensional limits are related to the copper alloy 110 product fired to $\frac{1}{2}$ hardness.

After the bond is completed the system can be annealed to soften the copper to reduce lead stress. Such a heat treatment can be a post bonding anneal at 225° C. for one hour or 155° C. for 24 hours. The time-temperature trade-off can be adjusted for any intermediate temperature. These values are well within the ranges of typical semiconductor device burn-in operations. It has been found that after the above described bonding typical 14-lead gang bonded chips show a bond strength of 65±20 grams (the force required to rupture the bond). The bond strength and the variation encountered indicate that the bumped leads of the invention are eminently suitable for gang bonded device assembly.

ALTERNATIVE EMBODIMENTS

FIG. 5 shows an alternative bump shape. Here the bump edges are rounded but the essential trapezoidal shape is present. The main difference is that the center of the bump is slightly higher than the rest of the face so that it makes contact first with the pad during bonding. This shape is regarded as somewhat superior to that of FIG. 2. The rounded shape can be obtained by subjecting the structure of FIG. 2a to a polishing etch. This could be either chemically controlled or electro-chemically controlled and is operated to round off the edges of the metal shape. Since the bump side of the strip is usually etched first, only the bump side will be rounded. The opposite side of the structure will have the usual shape.

FIG. 6a shows a metal contact finger 20 that represents one element in a composite tape intended for high speed automatic assembly applications. My above-mentioned copending application Ser. No. 921,643 filed July 3, 1978 now Pat. No. 4,209,355 discloses the fabrication of such a tape. While only one finger is shown in FIG. 6, it is to be understood that a plurality of such fingers are bonded to a strip of insulating material and will be arrayed around the periphery of an aperture in the insulating strip. Typically the composite strip is fabricated and the semiconductor chip bonded to the fingers that extend into the aperture. Then the fingers are severed just inside the periphery of the aperture at an excise line (indicated as along line 22 in FIG. 6). The chip plus finger pattern is then bonded to the device that will ultimately carry the chip such as a lead frame or hybrid substrate.

In FIG. 6a finger 20 is shown extending in cantilever fashion from the edge of an insulating strip, a portion of which is illustrated at 21. The strip portion of finger 20 that overlaps insulator 21 is securely bonded thereto in the composite strip fabrication process. At the extreme end of finger 20 a bump 23 is disposed on the underside. This is the bump of the kind illustrated in FIGS. 1 through 5. In the portion of the finger that will be ultimately thermocompression bonded to the device-carrying structure a pair of ribs 25 has been created, preferably simultaneously with the formation of bump 23 in the composite tape fabrication process. Those ribs have the general cross-sectional shape as the bump but can be wider. FIGS. 6b through 6g show the finger cross section at various points to illustrate the overall shape. It can be seen that the finger is of substantial thickness at all points except adjacent to where it is to be thermocompression bonded. In the bond regions the preferred bump shape is present. Clearly the finger, being of substantial cross section, will easily be capable of cantilever selfsupport in the composite tape form.

FIG. 7 illustrates a finger 20 of the kind detailed in FIGS. 6a thru 6g as it would be used in a hybrid assembly process. The assembly sequence could be as follows. First, the semiconductor chip 26 is thermocompression bonded to the composite tape mounted fingers, one of which is illustrated at 20, while the fingers are associated with the composite tape. Thermode 27 applies the necessary heat and pressure to gang bond the fingers to the semiconductor chip. The fingers are then excised from the tape at 22. Chip 26 is then bonded to pad 28 on hybrid substrate 29 by means of solder, epoxy, or other means at 30. Then the end of finger 20 that includes ribs 25 will be thermocompression bonded to pad 31 by the action of thermode 32. The ribs 25 will collapse as did bump 23 and thus produce a controlled collapse bond to pad 31. In some assembly processes chip and finger bonding are done simultaneously. As in the case of chip bonding, the finger to pad bonding is a gang bonding operation wherein all fingers are simultaneoulsy bonded to the hybrid substrate with controlled collapse ensuring reliable gang bonding.

Still another application of the gang bonding (not illustrated) is in the dual-in-line package (DIP) approach. In this application, the IC chip is gang bonded to the fingers on a composite tape. The outer ends of the fingers are then gang bonded in a conventional lead frame that can be gold plated nickel-iron alloy. The lead frame along with the copper finger attached chip is supplied with a block of transfer molded plastic that acts as an encapsulant and physical housing. The DIP structure is disclosed in U.S. Pat. No. 3,838,094 to Christian R. Sporck.

It is clear that the above described process can be mechanized and the bonding operations carried out rapidly and precisely. The use of the bumps of the invention results in a reliable gang bonded assembly. While the preferred embodiment and the illustrations show thermocompression bonding, the outer ends of the copper fingers can be bonded by other means such as reflow soldering.

The invention has been described and its utilization has been detailed. It is clear that a person skilled in the art will be aware of alternatives and equivalents within the spirit and intent of the invention. For example, while the invention has been illustrated using composite tape, it can be employed as well in copper tape processing. Accordingly, it is intended that the scope of the invention be limited only by the claims that follow.

I claim:

1. The method of making contact with the contact pads arrayed on a semiconductor device comprising the steps:

creating a tape having a succession of metal finger patterns with each pattern having inwardly extending portions terminating in tips that form an array that mates with said contact pads on said semiconductor device, said tips having transversely extending bumps adapted for thermocompression gang bonding to said contact pads, each said bump being configured to have a columnar form in which the bonding face is smaller than the bump portion adjacent to said finger and wherein said bump has a substantially trapezoidal cross section and a substantially flat bonding face that is parallel with the plane of said finger;

making said substantially flat bonding face slightly convex;

locating said tape so that said tips of said finger patterns are in registry with the contact pads of a semiconductor device; and pressing a heated bonding tool against said finger tips on the face opposite said bumps whereby said bumps are deformed by self limiting collapse and are thereby thermocompression gang bonded to said contact pads.

2. The process of claim 1 including the step of making said bump bonding face to have a width of about 1.5 to 2.0 mils.

3. The process of claim 2 including the step of gold plating said fingers prior to bonding.

4. The process of claim 1 including the additional steps of:

excising said fingers from said tape thereby producing a semiconductor device with metal fingers extending outwardly therefrom; and bonding said extending fingers to a secondary metal structure.

5. The process of claim 4 including the further step of encapsulating the thus produced device.

* * * * *